United States Patent
Lau

(10) Patent No.: US 10,765,983 B2
(45) Date of Patent: Sep. 8, 2020

(54) FILTER FOR IMMERSION COOLING APPARATUS

(71) Applicant: Bitfury Group Limited, George Town, Grand Cayman (KY)

(72) Inventor: Kar-Wing Lau, Tsing Yi (CN)

(73) Assignee: Bitfury IP B.V., Amsterdam (NL)

( * ) Notice: Subject to any disclaimer, the term of this patent is extended or adjusted under 35 U.S.C. 154(b) by 0 days.

(21) Appl. No.: 15/595,067

(22) Filed: May 15, 2017

(65) Prior Publication Data

US 2017/0326489 A1   Nov. 16, 2017

(30) Foreign Application Priority Data

May 16, 2016 (GB) .................................. 1608565.6

(51) Int. Cl.
   - B01D 46/00 (2006.01)
   - H05K 7/20 (2006.01)
   - B01D 46/24 (2006.01)

(52) U.S. Cl.
   CPC ..... B01D 46/0005 (2013.01); B01D 46/0036 (2013.01); B01D 46/2411 (2013.01);
   (Continued)

(58) Field of Classification Search
   None
   See application file for complete search history.

(56) References Cited

U.S. PATENT DOCUMENTS

| 2,577,188 A | * | 12/1951 | Hall ...................... F01M 5/002 |
| | | | 184/104.2 |
| 3,486,309 A | * | 12/1969 | Wild ...................... B01D 46/10 |
| | | | 15/301 |

(Continued)

FOREIGN PATENT DOCUMENTS

| FR | 1064730 A | 5/1954 |
| FR | 3015645 A1 | 6/2015 |

(Continued)

OTHER PUBLICATIONS

Simons et al., "A Survey of Vapor Phase Cooling Systems," Electrical Design News 14(1):53-56 (1969).
(Continued)

*Primary Examiner* — Robert J Popovics
(74) *Attorney, Agent, or Firm* — Goodwin Procter LLP

(57) ABSTRACT

An immersion cooling system for electronic equipment including a tank adapted to hold a liquid heat transfer fluid into which the electronic equipment can be immersed and a filter assembly(ies) having a filter housing with an inlet and an outlet and containing a filter cartridge. In some embodiments the filter assembly(ies) is adapted to be located in the heat transfer fluid in the tank, such that a cross-sectional area of the filter housing inlet is greater than a cross-sectional area of the filter housing outlet, the filter housing inlet is substantially vertically oriented on a side of the filter housing, the filter cartridge is positioned within the filter housing at an inclined angle relative to the filter housing inlet, and the filter housing outlet is disposed adjacent to a top of the housing. Advantageously, heat generated by the immersed electronic equipment produces a convective flow of heat transfer fluid through the filter housing.

20 Claims, 4 Drawing Sheets

(52) U.S. Cl.
CPC ......... *H05K 7/203* (2013.01); *H05K 7/20236* (2013.01); *H05K 7/20272* (2013.01); *B01D 2265/021* (2013.01)

(56) References Cited

U.S. PATENT DOCUMENTS

| | | | | |
|---|---|---|---|---|
| 3,928,008 | A * | 12/1975 | Petersen | B01D 46/10 55/417 |
| 4,002,443 | A * | 1/1977 | Lorenz | B60H 3/0616 55/357 |
| 4,328,014 | A * | 5/1982 | Burgoon | A47L 9/20 15/352 |
| 4,352,737 | A * | 10/1982 | Taniguchi | B01D 35/0273 210/167.08 |
| 4,580,313 | A * | 4/1986 | Blehert | A47L 11/24 15/349 |
| 4,704,658 | A | 11/1987 | Yokouchi et al. | |
| 4,867,879 | A | 9/1989 | Mueller | |
| 5,131,233 | A | 7/1992 | Cray et al. | |
| 5,573,562 | A * | 11/1996 | Schauwecker | B01D 46/0005 220/371 |
| 5,688,398 | A | 11/1997 | Jacquelin et al. | |
| 6,019,167 | A | 2/2000 | Bishop et al. | |
| 6,058,898 | A * | 5/2000 | Freese, V | F01M 11/0004 123/195 C |
| 6,447,566 | B1 * | 9/2002 | Rivera | B01D 46/0005 55/482 |
| 6,488,844 | B2 * | 12/2002 | Willis | B01D 35/027 184/106 |
| 6,616,836 | B1 * | 9/2003 | Covington | B01D 29/016 210/167.02 |
| 6,676,721 | B1 * | 1/2004 | Gillingham | B01D 46/0005 55/302 |
| 6,827,848 | B2 * | 12/2004 | Covington | B01D 29/016 210/167.02 |
| 7,911,782 | B2 * | 3/2011 | Attlesey | G06F 1/20 165/104.33 |
| 8,075,772 | B2 * | 12/2011 | Suga | B01D 29/01 123/196 A |
| 8,764,870 | B2 * | 7/2014 | Antony | B01D 46/125 55/484 |
| 8,877,054 | B2 * | 11/2014 | Andersen | B01D 35/303 210/232 |
| 10,045,673 | B2 * | 8/2018 | Foenss | A47L 9/00 |
| 10,206,307 | B2 * | 2/2019 | Lau | H05K 7/2029 |
| 2002/0095763 | A1 * | 7/2002 | Willis | B01D 35/027 29/453 |
| 2003/0235036 | A1 | 12/2003 | Ostby | |
| 2006/0219620 | A1 | 10/2006 | Suga | |
| 2007/0000219 | A1 * | 1/2007 | Park | B01D 46/0005 55/300 |
| 2007/0263356 | A1 | 11/2007 | Weber et al. | |
| 2008/0115528 | A1 | 5/2008 | Yamamoto et al. | |
| 2011/0075353 | A1 * | 3/2011 | Attlesey | G06F 1/20 361/679.47 |
| 2013/0021752 | A1 | 1/2013 | Campbell et al. | |
| 2014/0218861 | A1 | 8/2014 | Shelnutt et al. | |
| 2015/0062806 | A1 | 3/2015 | Shelnutt et al. | |
| 2015/0109730 | A1 | 4/2015 | Campbell et al. | |
| 2017/0325355 | A1 * | 11/2017 | Lau | H05K 7/2029 |
| 2017/0326489 | A1 * | 11/2017 | Lau | B01D 46/0005 |

FOREIGN PATENT DOCUMENTS

| | | |
|---|---|---|
| GB | 1595094 A | 8/1981 |
| GB | 2171024 A | 8/1986 |
| GB | 2327625 A | 2/1999 |

OTHER PUBLICATIONS

International Search Report and Written Opinion for International Pateant Application No. PCT/IB2017/000679, dated Aug. 21, 2017 (13 pages).
Ramaswamy et al. "Combined Effects of Sub-Cooling and Operating Pressure on the Performance of a Two-Chamber Thermosyphon," IEEE Transactions on Component and Packaging Technology, vol. 23(1) (2000).
U.S. Appl. No. 15/584,670, Immersion Cooling, filed May 2, 2017.

* cited by examiner

FILTER FOR IMMERSION COOLING APPARATUS

CROSS-REFERENCE TO RELATED APPLICATIONS

This application claims the benefit of U.K. Application No. GB1608565.6 filed May 16, 2016, which is hereby incorporated herein by reference in its entirety.

TECHNICAL FIELD

The present disclosure relates to immersion cooling and more particularly to the filtering of coolant fluid in an immersion cooling system.

BACKGROUND

Immersion cooling is a technique used to cool electronic equipment. It involves immersing the electronic equipment in a tank containing coolant that is in liquid form. Heat generated by the electronic equipment is transferred to the coolant fluid which undergoes evaporation, convection, and condensation, thereby ensuring that the temperature of the electronic equipment remains within a required operating range.

This method of cooling may be more effective and efficient than traditional air cooling for reasons such as the higher specific heat capacity of liquids compared to air, the advantageous cooling rate provided by a fluid that evaporates, and the undesirable energy required by fans that need to drive air through a system.

Coolant fluids (hereinafter may be referred to as heat transfer fluids or fluids) used must be non-conductive in order to not short or damage electronic equipment submerged within, and ideally evaporate at a low temperature. An example coolant fluid often used is the NOVEC™ Engineered Fluid manufactured by 3M™ of St. Paul, Minn.

The fluid may become contaminated during operation due to the leaching of primarily oils out of elastomers (for example common in PVC cable insulations) due to the solvent properties of some of the fluids. There might also be general contamination of the coolant fluid during normal maintenance and setup of the system.

It is important for the coolant fluid to remain pure by being filtered in order that it retains its advantageous properties and continues to provide maximum performance. Active-filtering when the fluid is pumped through a filter is effective, however it requires energy and therefore defeats an objective of immersion cooling that is to save energy.

Such coolant fluids are often expensive and therefore it is desirable to minimize loss of coolant fluid during the replacement of filters. Furthermore it is desirable for a low amount of coolant fluid to be required within the system, by designing it as compact as possible.

With the above in mind, it is an aim of the present invention to provide an improved immersion cooling system and filter assembly.

SUMMARY

In one aspect the present invention provides an immersion cooling system for electronic equipment.

A tank holds heat transfer fluid in liquid form into which the electronic equipment can be immersed. There are one or more filter assemblies, each filter assembly having a filter housing with an inlet and an outlet and containing a filter cartridge. At least one filter assembly is located within the liquid held by the tank. The cross-sectional area of the filter housing inlet is greater than the cross-sectional area of the filter housing outlet. The filter housing inlet is substantially vertically oriented on a side of the filter housing and the filter cartridge is positioned within the filter housing at an inclined angle relative to the filter housing inlet. The filter housing outlet is disposed adjacent to a top of the housing. Heat generated by the electronic equipment when immersed in the tank produces a convective flow at first, and later with increasing fluid temperature, a turbulent flow of heat transfer fluid through the filter housing.

It is an advantage that reduction in cross-sectional area between the filter housing inlet and outlet can help induce velocity into the fluid as it passively flows through the filter due to convection. It is a further advantage that the inclined angle of the filter cartridge provides for there to be a large inlet for fluid to flow whilst fluid is dragged through the filter cartridge due to convective forces. This also means that the filter housing takes up only a small amount of horizontal space. Consequently, the natural forces of convection will ensure a substantial amount of heated fluid will enter the filter housing inlet whilst there is also a desirably low volume of heated fluid in the system.

The inclined angle may be preferably between 5 and 25 degrees, or more preferably between 12 and 18 degrees. At these angles it is found that there is an appropriate balance between ensuring fluid flows through the filter cartridge, whilst the filter housing has a narrow footprint. In contrast, if the filter cartridge lay horizontally, a larger amount of fluid would be required to fill the system.

Electronic equipment may be immersed in the tank adjacent to the face of the filter housing thereby forming a vertical channel through which heat transfer fluid flows over the electronic equipment and subsequently enters the filter housing inlet. This arrangement allows electronic equipment to be mounted vertically, which is desirable, so that the electronic equipment may be easily inserted and removed without any need to move the filter cartridges out of the way.

In another aspect the present invention provides a filter assembly for use with an immersion cooling system containing heat transfer fluid. The filter assembly comprises a filter cartridge having a filter cartridge inlet and a filter cartridge outlet. The filter assembly further comprises a filter housing having a filter housing inlet, a filter housing outlet, a top, and a side. The cross-sectional area of the filter housing inlet is greater than the cross-sectional area of the filter housing outlet, and the cross-sectional area of the filter cartridge inlet is greater than the cross-sectional area of the filter cartridge outlet. The filter housing inlet is formed in the side of the filter housing, the filter cartridge is positioned within the filter housing at an inclined angle relative to the filter housing inlet, and the filter housing outlet is disposed adjacent to the top of the housing.

The inclined angle may be preferably between 5 and 25 degrees, or more preferably between 12 and 18 degrees.

The filter cartridge may be configured to filter primarily oils and general contamination of the coolant fluid in order that the fluid remains pure.

The filter cartridge inlet may extend across substantially all of one side of the cartridge, and the filter cartridge outlet may extend across only an upper portion of an opposite side of the cartridge.

The filter cartridge may further comprise at least one cartridge surrounding surface that is substantially perpendicular to the face of the filter cartridge inlet, the filter housing being shaped to conform to the at least one cartridge surrounding surface.

It is advantageous for the filter cartridge to fit snugly within the filter housing so that the filter cartridge is secure. Furthermore it is desirable that fluid does not flow around the filter cartridge within the filter housing.

The filter cartridge outlet may be centered on a point within the upper half of the filter cartridge in order to allow the fluid path to further conform to the fluid path generated by natural convection forces.

The filter assembly may further comprise one or more circular extruded bore holes for insertion of removable cylindrical locking rods that secure the filter cartridge, the filter cartridge being removable by removing the cylindrical locking rods. The use of cylindrical locking rods ensures that the filter cartridge is easily removable and secure whilst being minimally obtrusive.

The filter cartridge may be a carbon filter cartridge, preferably a common 3M™ half-face gas mask filter or similar type.

A single filter housing of a filter assembly may be configured to further comprise a plurality of filter units that are disposed adjacent to each other, wherein each filter unit comprises a filter housing inlet, a filter housing outlet, and a filter cartridge. The inclusion of multiple filter units allows the same filter cartridges to be used in large assemblies as well as being easy to manufacture/maintain/replace.

The filter housing inlet of each filter unit may face in the same direction, or in a unique direction, or in a first direction opposing a second direction faced by adjacent filter unit(s). Alternating the inlet face along a housing containing a plurality of filter units allows a single housing to be placed in between two pieces of electrical equipment, thereby utilizing space and fluid efficiently.

The vertical height of the filter housing may be greater than the horizontal width of the filter housing. This is advantageous in that the volumetric space required horizontally is minimized.

A weight such as a metal plate may be attached to a bottom surface of the filter assembly in order to act as a counterweight. This ensures that the housing assembly remains submerged by fluid and allows the housing assembly to be manufactured from materials that have a lower density than the fluid, for example, acrylic plastic.

DETAILED DESCRIPTION

Figure 1:
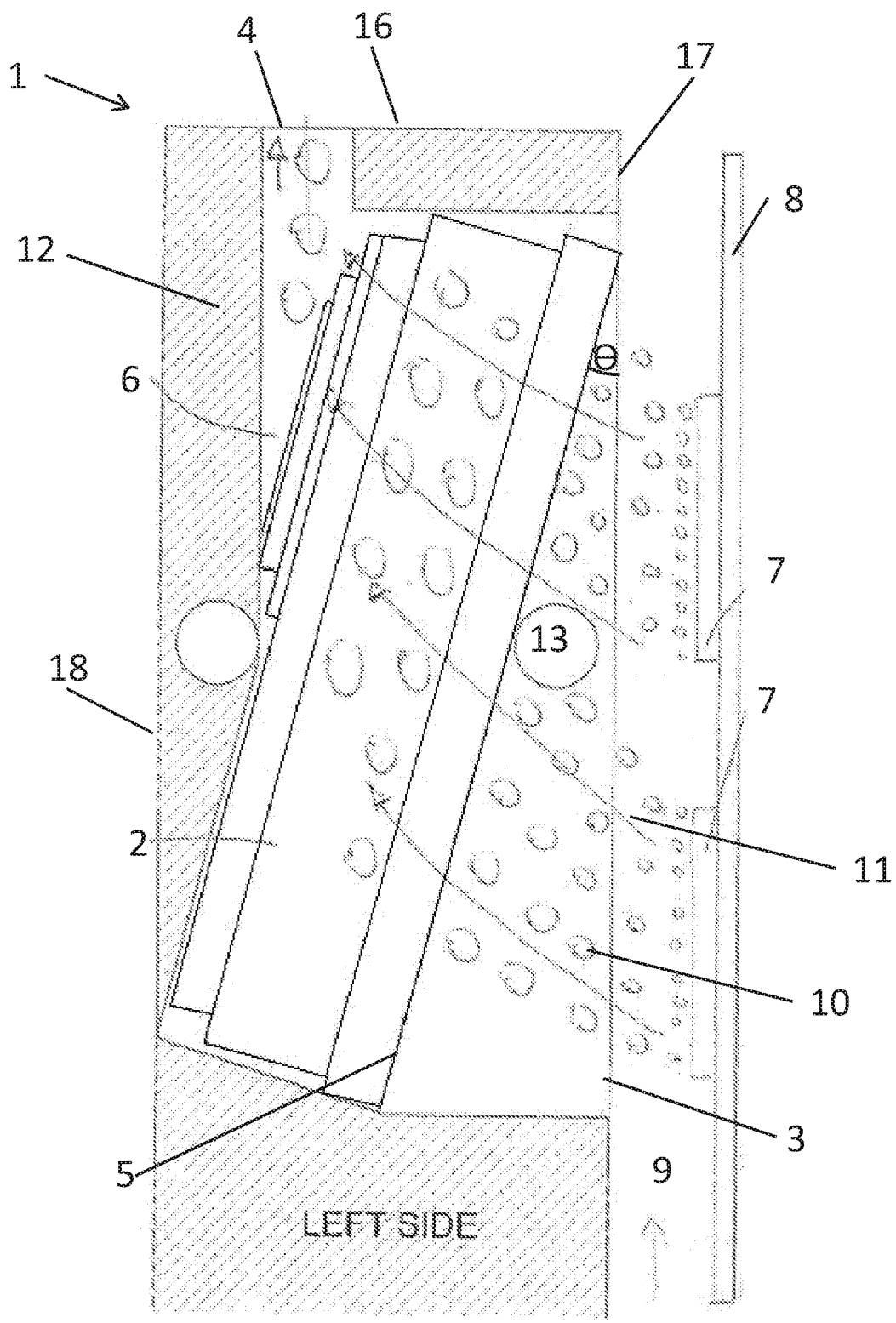
FIG. 1 is a cross-sectional view from the side of an immersion cooling system in accordance with an embodiment of the present invention.
Figure 2:
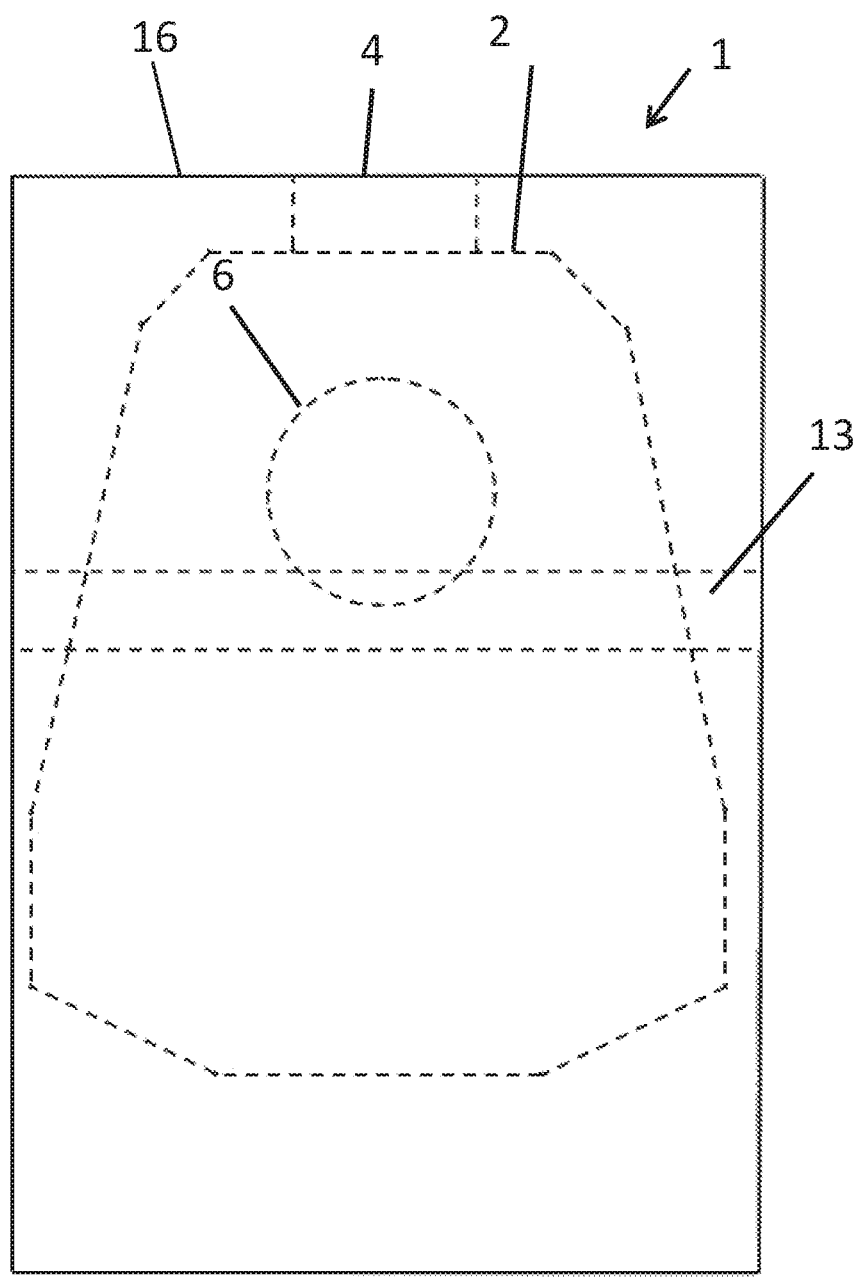
FIG. 2 is a view from the front of a filter assembly device in accordance with an embodiment of the present invention.

With reference to FIGS. 1 and 2, there is shown a device in accordance with an embodiment of the present invention.

A filter assembly 1 includes a filter housing 12 that contains a filter cartridge 2. The filter housing 12 has a filter housing inlet 3 located on a substantially vertical side 17, and a filter housing outlet 4, adjacent a top of the housing, which in the embodiment shown is on a top surface 16. There is also a substantially vertical side 18. The filter cartridge 2 has a filter cartridge inlet 5 and a filter cartridge outlet 6. The filter cartridge inlet 5 extends across substantially all of one side of the cartridge, while filter cartridge outlet 6 extends across only an upper portion of an opposite side of the cartridge. Electronic equipment 7 may be mounted on a board 8 and disposed opposite the filter housing inlet 3. The filter assembly 1 and the electronic equipment 7 are submerged in heat transfer fluid 9 in a tank (not shown).

The term "vertical" refers to the vertical direction with respect to all the figures. The terms "horizontal" and "lateral" refer to a lateral direction with respect to the cross-sectional FIGS. 1, 3, and 4. The device may be substantially vertical in order to rely on the convection created by the buoyancy of vapor bubbles, as described further below.

With reference to FIG. 1, the heat transfer fluid 9 may be a fluid such as the 3M™ NOVEC™ Engineered Fluid that does not damage or short-circuit electronic equipment/circuitry that is submerged within. The heat transfer fluid may have a specific boiling point so that heat generated by electronic equipment 7 is sufficient to cause the fluid to convert to vapor, thereby aiding in the cooling process of the electronic equipment 7. This process of two-phase immersion cooling maintains the temperature of electronic equipment within a predetermined operating temperature.

In operation, with reference to FIG. 1, fluid 9 flows around the tank due to the force of convection. As fluid 9 passes over the electronic equipment 7, heat generated by the electronic equipment 7 is transferred to the fluid 9. Vapor bubbles 10 are created as the fluid 9 is vaporized due to the heat from the electronic equipment. The vapor bubbles 10 expand rapidly and have a lower density than the surrounding coolant 9, and are therefore buoyant and rise upwards. Movement of the rapidly expanding vapor bubbles 10 creates turbulent vortices such that the vapor bubbles do not just travel straight up, but also in multiple complex directions due to the turbulence created, similar to an unguided explosion. The present invention takes advantage of this effect such that due to this turbulent vortex and vapor bubble buoyancy process, coolant liquid 9 is drawn through the filter housing inlet 3, and subsequently the filter cartridge 2 via the filter cartridge inlet 5. The direction of fluid flow through the filter housing 12 is shown by arrow 11. The fluid 9 is filtered as it flows through a filter cartridge 2. The fluid 9 exits the filter cartridge 2 via the filter cartridge outlet 6. The fluid subsequently exits the filter housing 12 via the filter housing outlet 4.

Vapor from the bubbles emerges from a top surface of the liquid (not shown), and is condensed back to a liquid. The condensed liquid is cooler (and denser) and sinks downwards within the tank (not shown).

With reference to FIG. 1, it is to be noted that the surface area of the face of the filter housing inlet 3 is greater than that of the face of the filter housing outlet 4. Furthermore the surface area of the face of the filter cartridge inlet 5 is greater than that of the filter cartridge outlet 6. As a result, the fluid 9 is forced through a series of openings that gradually narrow and constrict the flow as it flows through the filter housing 1. The primary effect of this is to induce a velocity into the flow through the filter cartridge by way of a "funnelling" effect.

With reference to FIG. 1, it is also to be noted that the cartridge 2 is positioned at an angle θ relative to the vertical face of the filter housing inlet 3. Angle θ may be between 5 and 25 degrees and is preferably between 12 and 18 degrees. Setting θ to be an angle within these ranges is found to create an ideal trade-off between occupying a minimal space horizontally and allowing fluid 9 to flow through the filter cartridge 2 using the convection created by buoyancy of the vapor bubbles 10. Furthermore, the positioning of the inlets 3, 5 and outlets 4, 6 allow the funnelling effect to be achieved using the filter cartridges shown when positioned at angle θ.

If the filter cartridges were positioned horizontally, they would need to be placed either above the electronic equipment and therefore require a higher fill level of liquid in the tank, or, they would be placed laterally beside the electronic equipment, thereby requiring the size of the tank to be extended laterally. Both of these scenarios result in an increased volume of liquid being required within the tank. The present solution provides for effective filtering whilst minimizing the volume of expensive coolant fluid that is required in an immersion cooling system. A further advantage of placing the filters in this manner is that they do not get in the way of the electronic equipment when the filters are lowered into, or raised out, of the cooling fluid in the tank.

With reference to FIGS. 1 to 5, the filter housing 12, 101 and filter cartridges 2, 102 occupy space that would otherwise contain coolant fluid thereby reducing the volume of coolant fluid required in the system.

With reference to FIGS. 1 to 4, the filter cartridge 2 may fit snugly within the filter housing 12 due to the internal dimensions of the filter housing 12, 101 that may be shaped to conform substantially to the surface contours/edges of the filter cartridge 2, 102. The filter cartridge 2, 102 may be sealingly secured within the filter housing 12, 101 so that fluid cannot flow around the filter cartridge 2, 102 within the filter housing 12, 101.

The entire filter assembly 1 may be removed from the system for maintenance including replacement of the filter cartridge 2. Instead of taking out filter cartridges 2 one by one, taking out an entire filter assembly 1, and optionally replacing with an already prepared filter assembly 1 with fresh filter cartridges 2, allows quick maintenance during which less of the expensive fluid 9 can be lost through evaporation. The filter cartridge 2 is secured in place using the locking bolt/pin 13. The filter cartridge 2 may be a 3M™ half-face gas mask filter, but may be of any similar type. An appropriate gas mask filter may be chosen depending on which contaminants are most prevalent in the respective coolant fluid.

Figure 3:
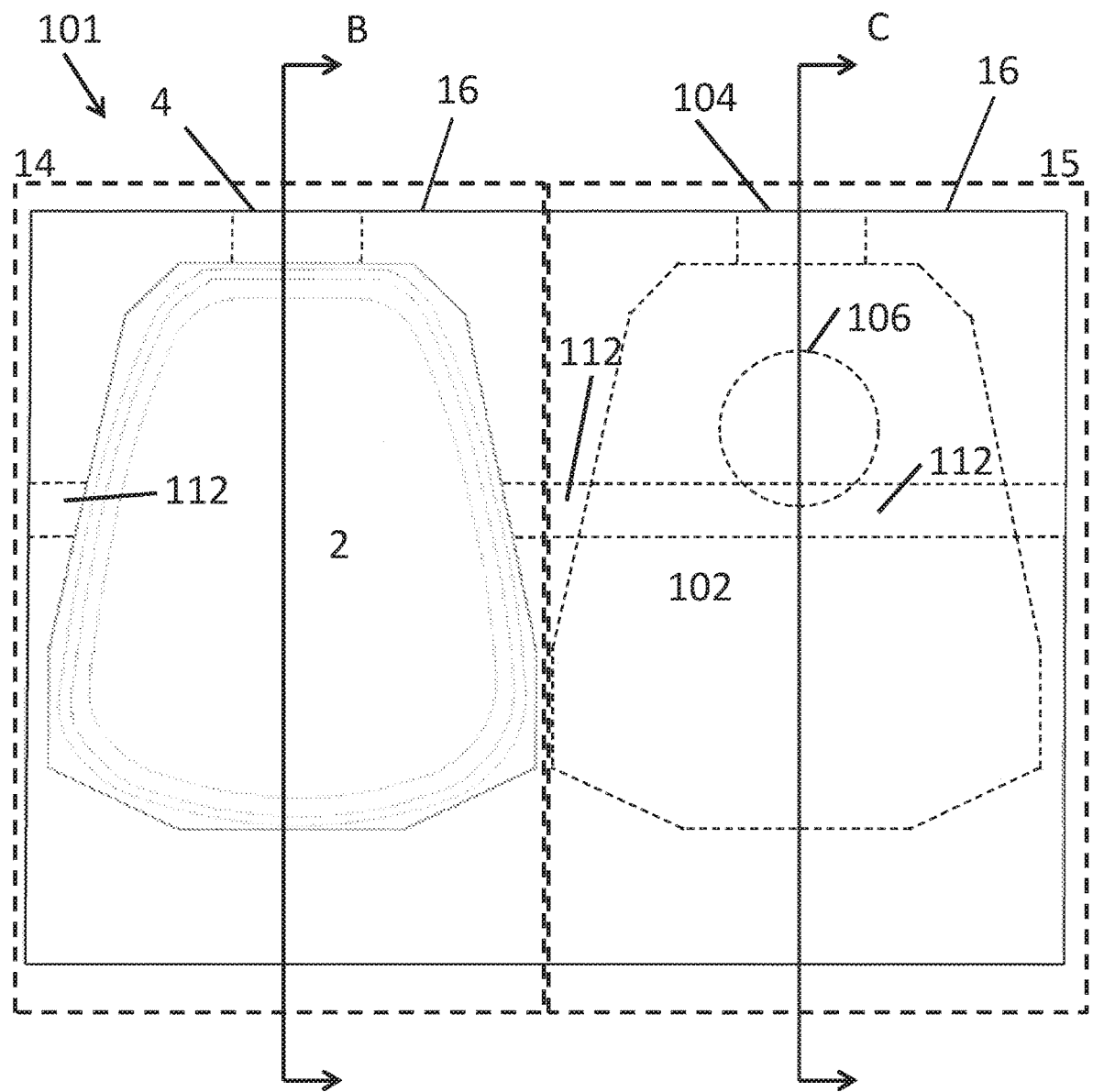
FIG. 3 is a view of a filter assembly device from the front in accordance with an embodiment of the present invention.
Figure 4:
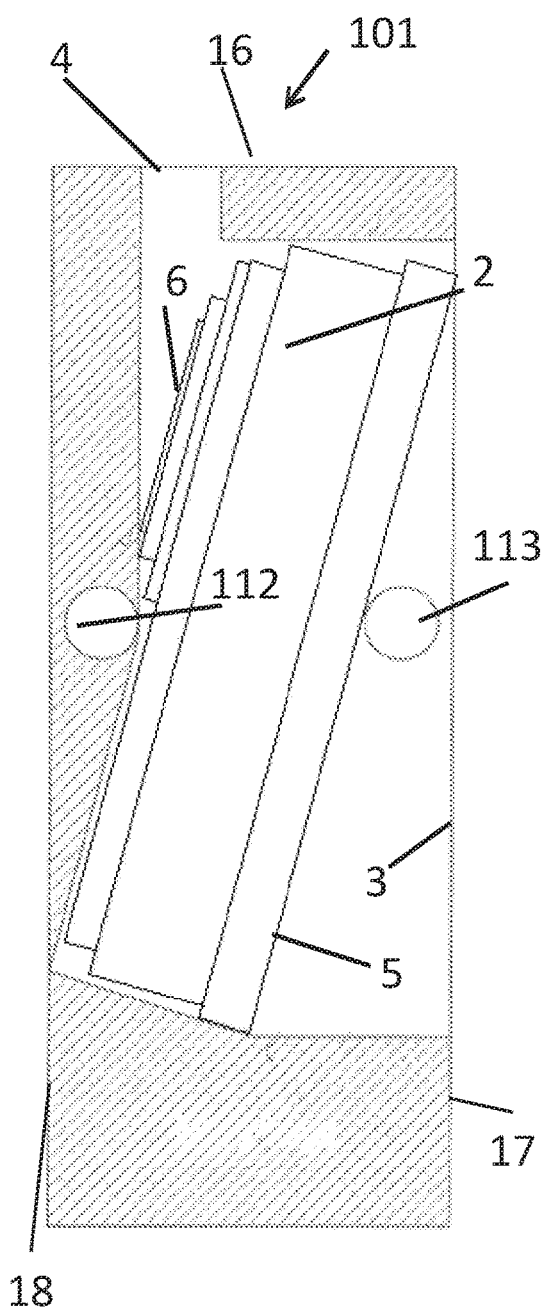
FIG. 4 is a cross-sectional view from the side of a filter assembly device in an embodiment of the present invention as viewed from axis B as shown in FIG. 3.
Figure 5:
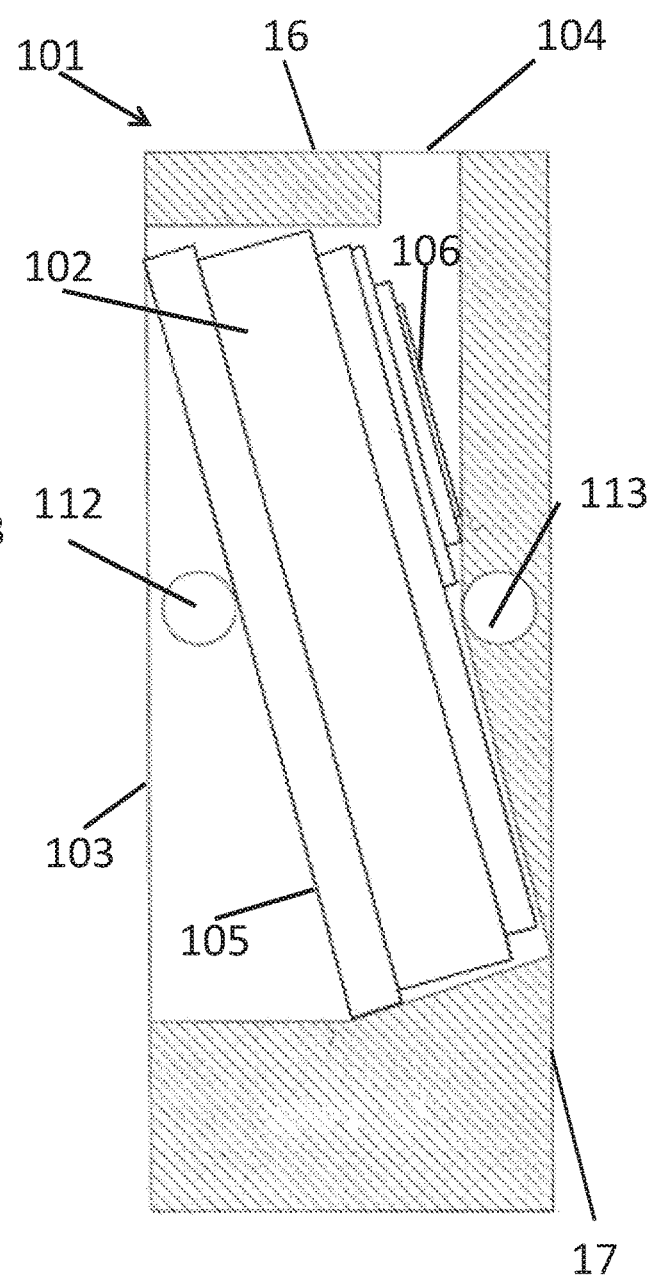
FIG. 5 is a cross-sectional view from the side of a filter assembly device in accordance with an embodiment of the present invention as viewed from axis C as shown in FIG. 3.

In accordance with another embodiment of the present invention, and with reference to FIGS. 3 to 5, each filter housing 101 may contain a pair of filter units 14, 15. Each filter unit comprises a filter cartridge 2, 102, a filter housing inlet 3, 103, a filter housing outlet 4, 104, a filter cartridge inlet 5, 105, and a filter cartridge outlet 6, 106. There may be two locking rods/pins 112, 113 that may be made of metal and extrude through the entire horizontal length of the filter housing 101.

With reference to FIGS. 3 to 5, the filter housing inlet 3 may face the opposite direction to filter housing inlet 103 and the orientation of all components may be reversed. This arrangement ensures optimal use of volume within the tank (not shown) as electronic equipment may be placed on either side of the filter housing 101. In this arrangement, locking rod 113 secures filter cartridge 2 in place, and locking rod 112 secures filter cartridge 102 in place.

In further embodiments of the present invention there may be multiple pairs of filter units 14, 15 in each filter housing 101. Alternatively there may be multiple units that face in the same direction, or a series of units wherein each unit may face in one direction of the other direction. Where all units face the same direction, or where there is a single unit in a filter housing, only one locking rod may be required to secure all filter cartridges.

In order to replace the filter cartridges 2, 102, the entire filter housing 101 may be removed from the immersion cooling system. The rods 112, 113 may be removed from the filter housing in order to release the filter cartridges 2, 102. After replacing filter cartridges 2, 102, and the rods 112, 113, the filter housing 101 may be replaced in the immersion cooling system. Furthermore maintenance or cleaning may be conducted on the filter housing 101 before reinsertion to the cooling system.

In further embodiments of the present invention there may be multiple filter housings 12, 101 containing one or more filter units 14, 15.

In further embodiments of the present invention the filter assembly 1 may further comprise one or more weights such as metal plates (not shown) attached to a bottom surface (not shown). The weight(s) act as a counterweight to ensure that the filter assembly 1 remains submerged in the fluid 9 allowing the housing assembly to be manufactured from materials that have a lower density than the fluid, such as acrylic plastic.

Having described certain embodiments of the invention, it will be apparent to those of ordinary skill in the art that other embodiments incorporating the concepts disclosed herein may be used without departing from the spirit and scope of the invention. The features and functions of the various embodiments may be arranged in various combinations and permutations, and all are considered to be within the scope of the disclosed invention. Accordingly, the described embodiments are to be considered in all respects as illustrative and not restrictive. The configurations, materials, and dimensions described herein are also intended as illustrative and in no way limiting. Similarly, although physical explanations have been provided for explanatory purposes, there is no intent to be bound by any particular theory or mechanism, or to limit the claims in accordance therewith.

What is claimed is:

1. An immersion cooling system for electronic equipment, wherein heat generated by the electronic equipment immersed in a heat transfer fluid produces a convective flow of the heat transfer fluid, the system comprising:
   a tank to hold the heat transfer fluid in liquid form into which the electronic equipment can be immersed; and
   at least one filter assembly, each filter assembly comprising:
      a filter housing through which the convective flow of heat transfer fluid travels and comprising an inlet and an outlet; and
      a filter cartridge contained in the filter housing, wherein,
      at least one filter assembly is located within the liquid heat transfer fluid in the tank;
      a cross-sectional area of the filter housing inlet is greater than a cross-sectional area of the filter housing outlet;
      the filter housing inlet is vertically oriented on a side of the filter housing;

the filter cartridge is positioned within the filter housing at an inclined angle relative to the filter housing inlet; and the filter housing outlet is disposed adjacent to a top of the housing.

2. The immersion cooling system of claim 1, wherein the inclined angle is between 5 and 25 degrees.

3. The immersion cooling system of claim 1, wherein the inclined angle is between 12 and 18 degrees.

4. The immersion cooling system of claim 1, wherein the electronic equipment is immersed in the tank adjacent to a face of the filter housing inlet thereby forming a vertical channel through which heat transfer fluid flows over the electronic equipment and subsequently enters the filter housing inlet.

5. A filter assembly for use with an immersion cooling system containing heat transfer fluid, said filter assembly comprising:

a filter cartridge having a filter cartridge inlet and a filter cartridge outlet; and a filter housing having a filter housing inlet, a filter housing outlet, a horizontal top, and a vertical side; wherein, a cross-sectional area of the filter cartridge inlet is greater than a cross-sectional area of the filter cartridge outlet;

the filter housing inlet is vertically oriented and formed in the vertical side of the filter housing;

the filter cartridge is positioned within the filter housing at an inclined angle relative to the vertical side of the filter housing and the filter housing inlet; and the filter housing outlet is disposed at the top of the housing, such that a lowermost opening of the filter housing outlet is located above the filter cartridge outlet.

6. The filter assembly of claim 5, wherein the inclined angle is between 5 and 25 degrees.

7. The filter assembly of claim 5, wherein the inclined angle is between 12 and 18 degrees.

8. The filter assembly of claim 5, wherein the filter cartridge filters oil from the heat transfer fluid.

9. The filter assembly of claim 5, wherein cross-sectional areas of fluid conduit openings formed by the inlet and outlet of the filter housing and the filter cartridge decrease along a path of heat transfer fluid flow, thereby increasing a velocity of heat transfer fluid flow from the inlet of the filter housing to the outlet of the filter housing.

10. The filter assembly of claim 5, wherein the filter cartridge inlet extends across one side of the filter cartridge.

11. The filter assembly of claim 5, wherein the filter cartridge further comprises at least one cartridge surrounding surface that is perpendicular to a face of the filter cartridge inlet, the filter housing being shaped to conform to the at least one cartridge surrounding surface.

12. The filter assembly of claim 5, wherein the filter cartridge outlet is centered on a point within an upper half of the filter cartridge.

13. The filter assembly of claim 5 further comprising:

at least one circular extruded bore hole for insertion of removable cylindrical locking rods that secure the filter cartridge, the filter cartridge being removable by removing the cylindrical locking rods.

14. The filter assembly of claim 5, wherein the filter cartridge comprises a carbon filter cartridge.

15. The filter assembly of claim 5, wherein the filter housing comprises a plurality of filter units disposed adjacent to each other, wherein each filter unit comprises a filter housing inlet, a filter housing outlet, and a filter cartridge.

16. The filter assembly of claim 15, wherein the filter housing inlet of each filter unit faces in a unique direction.

17. The filter assembly of claim 15, wherein the filter housing inlet of each filter unit faces in a first direction opposing a second direction faced by any adjacent filter unit.

18. The filter assembly of claim 5, wherein a vertical height of the filter housing is greater than a horizontal width of the filter housing.

19. The filter assembly of claim 5, further comprising a weight attached to a bottom surface of the filter assembly.

20. The filter assembly of claim 5, wherein the filter cartridge outlet extends across only an upper portion of an opposite side of the filter cartridge.

* * * * *